(12) United States Patent
Lee et al.

(10) Patent No.: US 12,310,172 B2
(45) Date of Patent: May 20, 2025

(54) DISPLAY DEVICE

(71) Applicant: Samsung Display Co., Ltd., Yongin-Si (KR)

(72) Inventors: Jeong Seok Lee, Yongin-si (KR); Oh June Kwon, Hwaseong-si (KR); Kwan Hyuck Yoon, Seoul (KR); Hye Kyun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 361 days.

(21) Appl. No.: 17/719,684

(22) Filed: Apr. 13, 2022

(65) Prior Publication Data

US 2023/0043912 A1    Feb. 9, 2023

(30) Foreign Application Priority Data

Jul. 29, 2021 (KR) .................. 10-2021-0099856

(51) Int. Cl.
| | |
|---|---|
| *H10K 50/858* | (2023.01) |
| *G06F 3/041* | (2006.01) |
| *H10K 50/844* | (2023.01) |
| *H10K 50/86* | (2023.01) |
| *H10K 59/122* | (2023.01) |
| *H10K 59/35* | (2023.01) |
| *H10K 59/40* | (2023.01) |
| *H10K 77/10* | (2023.01) |

(52) U.S. Cl.
CPC ......... *H10K 50/858* (2023.02); *G06F 3/0412* (2013.01); *H10K 50/844* (2023.02); *H10K 59/122* (2023.02); *H10K 50/865* (2023.02); *H10K 59/351* (2023.02); *H10K 59/40* (2023.02); *H10K 77/111* (2023.02)

(58) Field of Classification Search
CPC .. H10K 50/858; H10K 50/844; H10K 59/122; H10K 50/865; H10K 59/351; H10K 59/40; H10K 59/878; H10K 59/879; H10K 59/8792
See application file for complete search history.

(56) References Cited

U.S. PATENT DOCUMENTS

| | | |
|---|---|---|
| 9,614,168 B2 | 4/2017 | Zhang et al. |
| 11,527,740 B2 | 12/2022 | Kim et al. |

(Continued)

FOREIGN PATENT DOCUMENTS

| | | |
|---|---|---|
| JP | 2004-292190 A | 10/2004 |
| KR | 10-2020-0042981 A | 4/2020 |

(Continued)

*Primary Examiner* — David Vu
*Assistant Examiner* — Brandon C Fox
(74) *Attorney, Agent, or Firm* — Innovation Counsel LLP

(57) ABSTRACT

The present disclosure relates to a display device, and a display device according to an embodiment includes a substrate, a transistor disposed on the substrate, a light emitting element connected to the transistor, an encapsulation layer disposed on the light emitting element, a sensing electrode disposed on the encapsulation layer, a first insulating layer disposed on the sensing electrode and including an opening, a second insulating layer disposed on the first insulating layer, and a third insulating layer disposed on the second insulating layer, wherein a refractive index of the third insulating layer is higher than that of the second insulating layer.

20 Claims, 11 Drawing Sheets

(56) References Cited

U.S. PATENT DOCUMENTS

| | | | |
|---|---|---|---|
| 11,818,916 B2 | 11/2023 | Kim et al. | |
| 2006/0194453 A1 | 8/2006 | Murakami et al. | |
| 2022/0140010 A1* | 5/2022 | Lee | H10K 59/121 |
| | | | 345/173 |
| 2022/0140041 A1* | 5/2022 | Lee | H10K 59/126 |
| | | | 257/40 |
| 2023/0028269 A1* | 1/2023 | Jeong | H10K 59/35 |

FOREIGN PATENT DOCUMENTS

| | | |
|---|---|---|
| KR | 10-2020-0078796 A | 7/2020 |
| KR | 10-2020-0078874 A | 7/2020 |
| KR | 10-2020-0101571 A | 8/2020 |
| KR | 10-2021-0003989 A | 1/2021 |
| KR | 10-2021-0050031 A | 5/2021 |

* cited by examiner

DISPLAY DEVICE

CROSS-REFERENCE TO RELATED APPLICATION

This application claims priority to and the benefit of Korean Patent Application No. 10-2021-0099856 filed in the Korean Intellectual Property Office on Jul. 29, 2021, the entire contents of which are incorporated herein by reference.

BACKGROUND

1. Field

The present disclosure relates to a display device.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The display device has a multi-layered structure. For example, the display device may have a multi-layered structure in which a light emitting element, a touch sensor, and the like are stacked on a substrate. A screen may be displayed as light generated by the light emitting element passes through several layers of the multi-layered structure to be emitted to outside of the display device. However, some of the light generated by the light emitting device may be lost without being emitted to the outside by being reflected from an interlayer interface. Due to this, front light emitting efficiency and display quality of the display device may be deteriorated.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a display device that may improve light emitting efficiency and display quality.

An embodiment provides a display device including: a substrate; a transistor disposed on the substrate; a light emitting element connected to the transistor; an encapsulation layer disposed on the light emitting element; a sensing electrode disposed on the encapsulation layer; a first insulating layer disposed on the sensing electrode and including an opening; a second insulating layer disposed on the first insulating layer; and a third insulating layer disposed on the second insulating layer, wherein a refractive index of the third insulating layer is higher than that of the second insulating layer.

A refractive index of the third insulating layer may be 1.42 or more and 1.53 or less.

A refractive index of the second insulating layer may be 1.30 or more and 1.40 or less.

A refractive index of the third insulating layer may be 1.42 or more and 1.53 or less.

The first insulating layer may include a light absorbing material.

An optical density of the first insulating layer may be about 1 or more and about 5 or less.

The second insulating layer may include a silicon oxide.

Porosity of the second insulating layer may be 65% or more and 75% or less.

The second insulating layer may include a first portion disposed on the opening of the first insulating layer, a second portion disposed on an upper surface of the first insulating layer, and a third portion disposed between the first portion and the second portion in a plan view, and the third portion is disposed on a side surface of the first insulating layer.

The side surface of the first insulating layer may have a shape that is inclined with respect to an upper surface of the encapsulation layer.

A distance from the upper surface of the encapsulation layer to an upper surface of the second portion may be larger than a distance from the upper surface of the encapsulation layer to an upper surface of the first portion, and the third portion may have a shape that is inclined with respect to the upper surface of the encapsulation layer.

At least some of light emitted from the light emitting element may be totally reflected on an interface between the third portion of the second insulating layer and the third insulating layer to be emitted.

The first insulating layer may include a light absorbing material.

An optical density of the first insulating layer may be 1 or more and 5 or less.

The second insulating layer may include a silicon oxide.

Porosity of the second insulating layer may be 65% or more and 75% or less.

The light emitting element may include a pixel electrode connected to the transistor, an emission layer disposed on the pixel electrode, and a common electrode disposed on the emission layer.

The display device may further include a bank layer disposed on the pixel electrode and including a pixel opening overlapping the pixel electrode, wherein the emission layer may be disposed within the pixel opening, the common electrode may be disposed on the bank layer, and the opening may overlap the pixel opening.

The opening may be larger than the pixel opening in a plan view and may have a shape surrounding the pixel opening.

The display device may further include a polarization layer disposed on the third insulating layer, and a cover window disposed on the polarization layer.

According to the embodiments, it is possible to improve light emitting efficiency and display quality of a display device.

DETAILED DESCRIPTION

Figure 1:
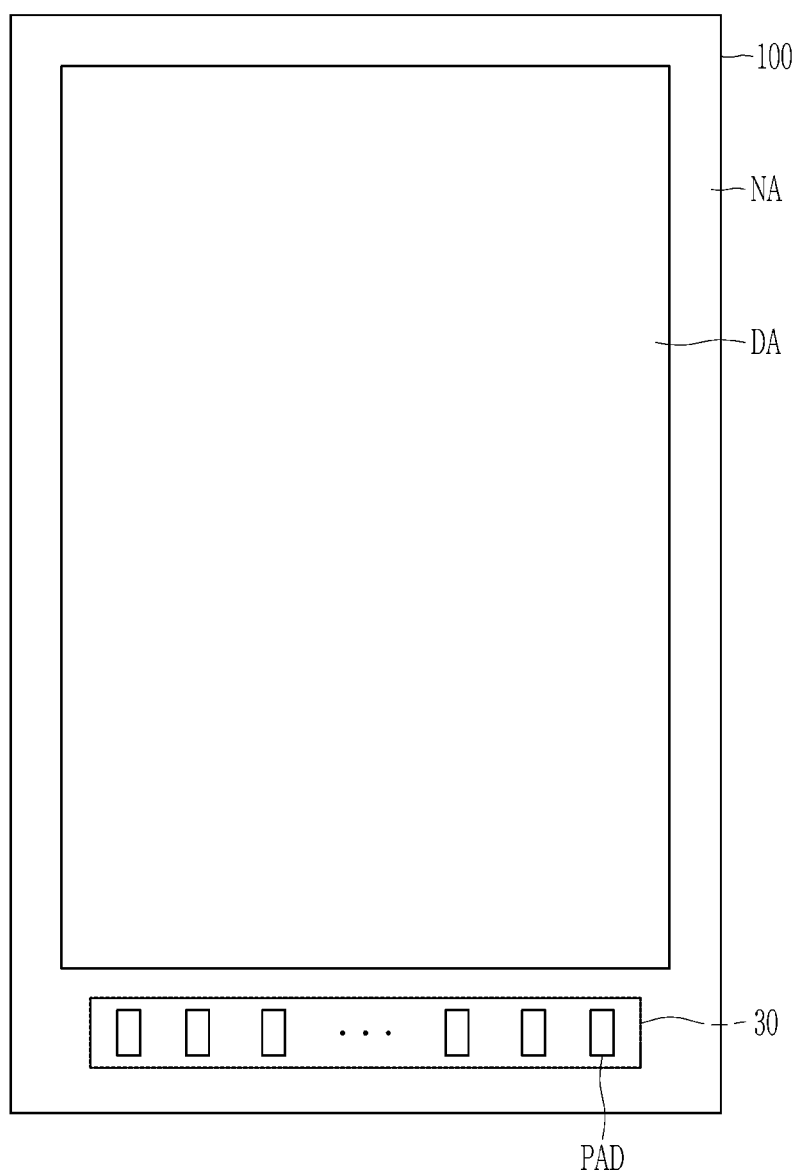
FIG. 1 illustrates a schematic top plan view of a display device according to an embodiment.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present inventive concept.

In order to clearly describe the present inventive concept, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

In addition, It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a display device according to an embodiment will be described with reference to FIG. 1 and FIG. 2.

Figure 2:
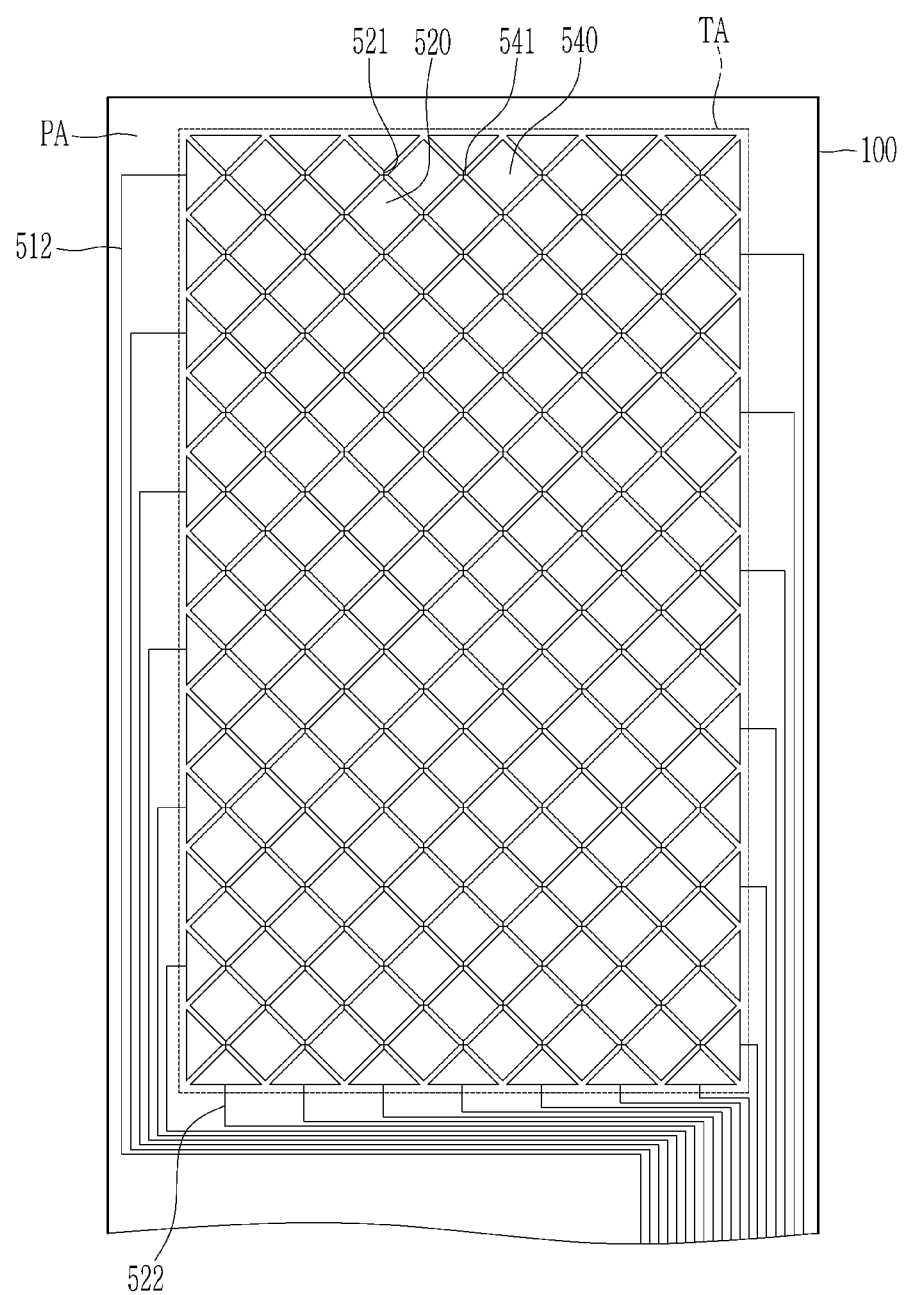
FIG. 2 illustrates a top plan view of a portion including a sensing part in a display device according to an embodiment.

FIG. 1 illustrates a schematic top plan view of a display device according to an embodiment, and FIG. 2 illustrates a top plan view of a portion including a sensing part in a display device according to an embodiment.

As shown in FIG. 1, a display device according to an embodiment includes a substrate 100 and a pad part 30.

The substrate 100 includes a display area DA and a non-display area NA. The display area DA is an area in which a pixel including a light emitting diode and a transistor are formed to display an image, and the non-display area NA is an area in which an image is not displayed. The non-display area NA may surround the display area DA. The non-display area NA is an area including the pad part 30 in which a pad PAD for applying a driving signal to the pixel is formed.

A plurality of pixels (not shown) including a transistor, a light emitting diode, and the like may be disposed in the display area DA. The plurality of pixels may be arranged in various forms, for example, may be arranged in a matrix form. A sensing area TA including a plurality of sensing electrodes 520 and 540 in FIG. 2 may be further disposed on the display area DA to recognize a touch.

A driving voltage line (not shown), a driving low voltage line (not shown), and the pad part 30 for transmitting a driving signal such as a voltage and a signal to the pixel formed in the display area DA, may be disposed in the non-display area NA. In addition, a plurality of sensing wires 512 and 522 in FIG. 2 may be further disposed in the non-display area NA. The plurality of sensing wires 512 and 522 may be connected to the plurality of sensing electrodes 520 and 540. The plurality of sensing wires 512 and 522, and the sensing electrodes 520 and 540 will be further described below with reference to FIG. 2.

The pad part 30 is disposed at a portion of the non-display area NA, and includes a plurality of pads PAD. A voltage, a signal, and the like may be applied to a plurality of voltage lines (not shown) and the plurality of sensing wires 512 and 522 in FIG. 2 connected to the display area DA through the plurality of pads PAD. A flexible printed circuit board (FPCB) (not shown) may be attached to the non-display area NA. The flexible printed circuit board (FPCB) may be electrically connected to the pad part 30. The flexible printed circuit board (FPCB) and the pad part 30 may be electrically connected to each other by an anisotropic conductive film. The flexible printed circuit board (FPCB) may include a driving integrated chip (not shown), and a driving signal outputted from the driving integrated chip may be supplied to respective pixels through the plurality of pads PAD of the pad part 30.

As shown in FIG. 2, the substrate 100 further includes the sensing area TA having the plurality of sensing electrodes 520 and 540 formed on an upper portion of the display area DA, and a peripheral area PA surrounding the sensing area TA. In some embodiments, the sensing area TA may include portions of the display area DA and the non-display area NA of FIG. 1, and the peripheral area PA may include an area excluding the sensing area TA from the non-display area NA of FIG. 1. However, this is only an example, and the positions of the sensing area TA and the peripheral area PA may be variously changed. For example, the sensing area TA may include a portion of the display area DA, and the peripheral area PA may include an area excluding the sensing area TA from the display area DA and the non-display area NA. Alternatively, the sensing area TA may include the display area DA and the non-display area NA.

The plurality of sensing electrodes 520 and 540 may be disposed in the sensing area TA. The plurality of sensing electrodes 520 and 540 may include a plurality of first sensing electrodes 520 and a plurality of second sensing electrodes 540. The sensing electrodes 520 and 540 may be formed on the same substrate 100 as the substrate 100 including the plurality of pixels. That is, the plurality of pixels and the sensing electrodes 520 and 540 may be disposed on a single panel.

The first sensing electrode 520 and the second sensing electrode 540 may be electrically separated from each other. In some embodiments, the first sensing electrode 520 may be a sensing input electrode and the second sensing electrode 540 may be a sensing output electrode. However, the present inventive concept is not limited thereto, and the first sensing electrode 520 may be a sensing output electrode and the second sensing electrode 540 may be a sensing input electrode.

The plurality of first sensing electrodes 520 and the plurality of second sensing electrodes 540 may be alternately dispersed so as to not overlap each other in the sensing area TA to form a mesh configuration. The plurality of first sensing electrodes 520 may be disposed in plural in a column direction and a row direction, respectively, and the plurality of second sensing electrodes 540 may also be disposed in plural in the column direction and in the row direction. The plurality of first sensing electrodes 520 may be connected to each other in the column direction by a plurality of first sensing electrode connecting parts 521, and the plurality of second sensing electrodes 540 may be connected to each other in the row direction by a plurality of second sensing electrode connecting parts 541.

The first sensing electrode 520 and the second sensing electrode 540 may be disposed on the same layer. In some embodiments, the first sensing electrode 520 and the second sensing electrode 540 may be disposed on different layers. The first sensing electrode 520 and the second sensing electrode 540 may have a rhombus shape, but the shape of the first sensing electrode 520 and the second sensing electrode 540 are not limited thereto. The first sensing electrode 520 and the second sensing electrode 540 may be polygonal such as quadrangular or hexagonal, or may be circular or oval, and may be implemented in various shapes such as having a protrusion to improve sensitivity of a sensing sensor. The first sensing electrode 520 and the second sensing electrode 540 may be formed of a transparent conductor or an opaque conductor. For example, the first sensing electrode 520 and the second sensing electrode 540 may include a transparent conductive oxide (TCO), and the transparent conductive oxide (TCO) may include at least one of an indium tin oxide (ITO), an indium zinc oxide (IZO), a zinc oxide (ZnO), a carbon nanotube (CNT), and graphene. In addition, the first sensing electrode 520 and the second sensing electrode 540 may include a plurality of openings. The openings formed in the sensing electrodes 520 and 540 serve to allow light emitted from the light emitting diode to be directed to the front without interference.

The plurality of first sensing electrodes 520 may be electrically connected to each other by the first sensing electrode connecting part 521 (also referred to as a bridge), and the plurality of second sensing electrodes 540 may be electrically connected to each other by the second sensing electrode connecting part 541. When the plurality of first sensing electrodes 520 are connected in a first direction, the plurality of second sensing electrodes 540 may be connected in a second direction crossing the first direction. When the first sensing electrode 520 and the second sensing electrode 540 are disposed on the same layer, one of the first sensing electrode connecting part 521 and the second sensing electrode connecting part 541 may be disposed on the same layer as the first sensing electrode 520 and the second sensing electrode 540, and the other thereof may be disposed on a different layer from that of the first sensing electrode 520 and the second sensing electrode 540. As a result, the plurality of first sensing electrodes 520 and the plurality of second sensing electrodes 540 may be electrically separated. The sensing electrode connecting part disposed on the different layer may be disposed on upper or lower layers of the first sensing electrode 520 and the second sensing electrode 540, and in an embodiment to be described below, an embodiment in which the sensing electrode connecting part is disposed on the lower layer, that is, a layer closer to the substrate, will be mainly described.

The plurality of sensing wires 512 and 522 respectively connected to the plurality of first sensing electrodes 520 and the plurality of second sensing electrodes 540 are disposed in the peripheral area PA. The plurality of sensing wires 512 and 522 may include a plurality of first sensing wires 512 and a plurality of second sensing wires 522. The first sensing wire 512 may be connected to the plurality of second sensing electrodes 540 disposed in the row direction, and the second sensing wire 522 may be connected to the plurality of first sensing electrodes 520 disposed in the column direction. In some embodiments, the first sensing wire 512 and the second sensing wire 522 may be electrically connected to a portion of the pad PAD included in the pad part 30 of FIG. 1.

FIG. 2 illustrates a mutual-cap type of sensing part that senses a touch by using two sensing electrodes 520 and 540. However, in some embodiments, a self-cap type of sensing part that senses a touch by using only one sensing electrode may be formed.

Hereinafter, a display device according to an embodiment will be further described with reference to FIG. 3 and FIG. 4.

Figure 3:
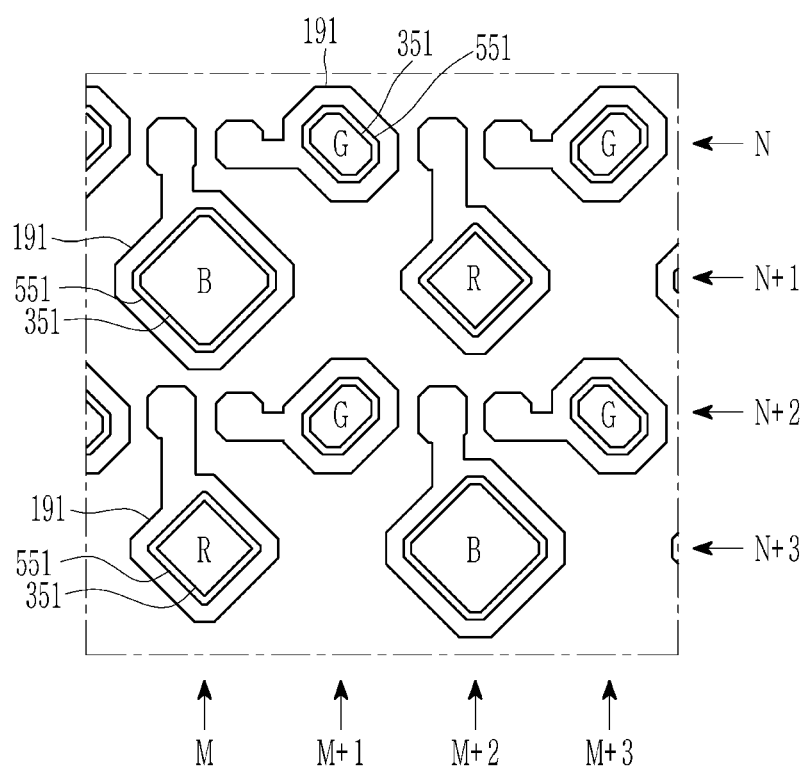
FIG. 3 illustrates a top plan view of some of a display device according to an embodiment.
Figure 4:
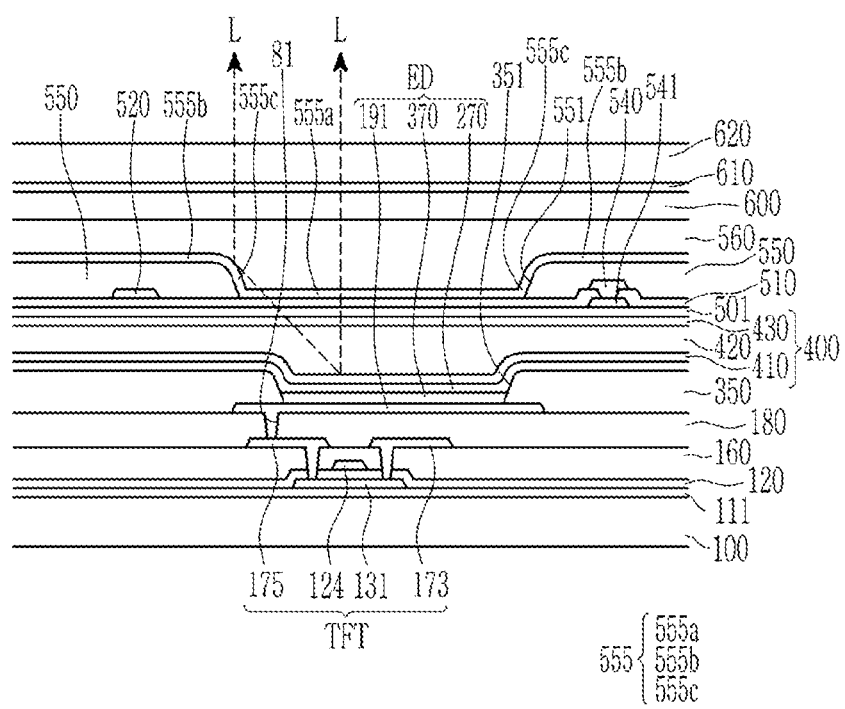
FIG. 4 illustrates a cross-sectional view of some of a display device according to an embodiment.

FIG. 3 illustrates a top plan view of some of a display device according to an embodiment, and FIG. 4 illustrates a cross-sectional view of some of a display device according to an embodiment. FIG. 3 illustrates an arrangement shape of a plurality of pixels in a plan view, and FIG. 4 illustrates a cross-sectional shape of one pixel.

As shown in FIG. 3, a display device according to an embodiment may include a plurality of pixels R, G, and B. The plurality of pixels R, G, and B may include a first pixel (R), a second pixel (G), and a third pixel (B). The first pixel (R) may display red, the second pixel (G) may display green, and the third pixel (B) may display blue. However, this is only an example, and the plurality of pixels may further include pixels displaying colors other than red, green, and blue. For example, the plurality of pixels may further include a white pixel. Alternatively, the plurality of pixels may include a pixel displaying cyan, a pixel displaying magenta, and a pixel displaying yellow.

As shown in FIG. 4, the display area DA of the display device according to the embodiment may include the substrate 100, a transistor TFT that includes a semiconductor 131, a gate electrode 124, a source electrode 173, and a drain electrode 175, a gate insulating film 120, a first interlayer insulating film 160, a second interlayer insulating film 180, a pixel electrode 191, an emission layer 370, a bank layer 350, a common electrode 270, and an encapsulation layer 400. Here, the pixel electrode 191, the emission layer 370, and the common electrode 270 may constitute a light emitting element ED. In addition, the display device may further include the sensing area TA disposed at an upper portion of the display area DA, and the sensing area TA may include a sensing insulating layer 510, the plurality of sensing electrodes 520 and 540, and the sensing electrode connecting part 541. In addition, the display device may further include a first insulating layer 550, a second insulating layer 555, and a third insulating layer 560 disposed above the sensing area TA.

The substrate 100 may include a material having a rigid characteristic, such as glass, or a flexible material that may be bent, such as plastic and polyimide. A buffer layer 111 for flattening a surface of the substrate 100 and blocking impurities from penetrating may be further disposed on the substrate 100. The buffer layer 111 may include an inorganic material, for example, an inorganic insulation material such as a silicon nitride (SiNx), a silicon oxide (SiOx), or a silicon oxynitride (SiOxNy). The buffer layer 111 may have a single-layered or multi-layered structure of the material. A barrier layer (not shown) may be further disposed on the substrate 100. In this case, the barrier layer may be disposed between the substrate 100 and the buffer layer 111. The barrier layer may include an inorganic insulation material such as a silicon nitride (SiNx), a silicon oxide (SiOx), and a silicon oxynitride (SiOxNy). The barrier layer BA may have a single-layer or multi-layered structure of the material.

The semiconductor 131 may be disposed on the substrate 100 on the buffer layer 111. The semiconductor 131 may include one of amorphous silicon, polycrystalline silicon, and an oxide semiconductor. For example, the semiconductor 131 may include a low temperature polycrystalline silicon (LTPS), or an oxide semiconductor material including at least one of zinc (Zn), indium (In), gallium (Ga), tin (Sn), and a mixture thereof. For example, the semiconductor 131 may include an indium-gallium-zinc oxide (IGZO). The semiconductor 131 may include a channel area, a source area, and a drain area that are classified according to whether or not impurity doping is performed. The source area and the drain area may have a conductive characteristic corresponding to a conductor.

The gate insulating film 120 may cover the semiconductor 131 and the substrate 100. The gate insulating film 120 may include an inorganic insulation material such as a silicon nitride (SiNx), a silicon oxide (SiOx), and a silicon oxynitride (SiOxNy). The gate insulating film 120 may have a single-layer or multi-layered structure of the material described above.

The gate electrode 124 may be disposed on the gate insulating film 120. The gate electrode 124 may include a metal such as copper (Cu), molybdenum (Mo), aluminum (Al), silver (Ag), chromium (Cr), tantalum (Ta), and titanium (Ti), or a metal alloy thereof. The gate electrode 124 may be formed as a single-layered or multilayered structure. An area of the semiconductor 131 that overlaps the gate electrode 124 in a plan view may be the channel area.

The first interlayer insulating film 160 may cover the gate electrode 124 and the gate insulating film 120. The first interlayer insulating film 160 may include an inorganic insulating material such as a silicon nitride (SiNx), a silicon oxide (SiOx), and a silicon oxynitride (SiOxNy). The first interlayer insulating film 160 may have a single-layered or multi-layered structure of the material described above.

The source electrode 173 and the drain electrode 175 may be disposed on the first interlayer insulating film 160. The source electrode 173 and the drain electrode 175 are respectively connected to the source area and the drain area of the semiconductor 131 through contact holes formed in the first interlayer insulating film 160 and the gate insulating film 120. Accordingly, the semiconductor 131, the gate electrode 124, the source electrode 173, and the drain electrode 175, which are described above, constitute one transistor TFT. In some embodiments, the transistor TFT may include only the source and drain areas of the semiconductor 131, and does not include the source electrode 173 and drain electrode 175.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), or a metal alloy thereof. The source electrode 173 and the drain electrode 175 may be formed as a single-layered or multilayered structure. The source electrode 173 and drain electrode 175 according to the embodiment may include a triple layer including an upper layer, an intermediate layer, and a lower layer. The upper layer and the lower layer may include titanium (Ti) and the intermediate layer may include aluminum (Al).

The second interlayer insulating film 180 may be disposed on the source electrode 173 and the drain electrode 175. The second interlayer insulating film 180 covers the source electrode 173, the drain electrode 175, and the first interlayer insulating film 160. The second interlayer insulating film 180 is for planarizing the surface of the substrate 100 which includes uneven surface due to the transistor TFT, may be an organic insulating film, and may include one or more of a polyimide, a polyamide, an acryl resin, benzocyclobutene, and a phenol resin.

The pixel electrode 191 may be disposed on the second interlayer insulating film 180. The pixel electrode 191 is also referred to as an anode electrode, and may be formed as a single layer or multilayer that includes a transparent conductive oxide film or a metal material. The transparent conductive oxide film may include an indium tin oxide (ITO), a poly-ITO, an indium zinc oxide (IZO), an indium gallium zinc oxide (IGZO), and an indium tin zinc oxide (ITZO). The metal material may include silver (Ag), molybdenum (Mo), copper (Cu), gold (Au), and aluminum (Al).

The second interlayer insulating film 180 may include a via hole 81 exposing the drain electrode 175. The drain electrode 175 and the pixel electrode 191 may be physically and electrically connected to each other through the via hole 81 of the second interlayer insulating film 180. Accordingly, the pixel electrode 191 may receive an output current to be transmitted from the drain electrode 175 to the emission layer 370.

The bank layer 350 may be disposed on the pixel electrode 191 and the second interlayer insulating film 180. The bank layer 350 is also referred to as a pixel defining layer (PDL) and includes a pixel opening 351 exposing at least a portion of the pixel electrode 191. In this case, the pixel opening 351 may overlap a central portion of the pixel electrode 191 and may not overlap edge portions of the pixel electrode 191. Accordingly, a size of the pixel opening 351 may be smaller than that of the pixel electrode 191. The bank layer 350 may define an area forming the emission layer 370 so that the emission layer 370 may be disposed on a portion where an upper surface of the pixel electrode 191 is exposed. The bank layer 350 may be an organic insulating film containing one or more of a polyimide, a polyamide, an acryl resin, benzocyclobutene, and a phenol resin. In some embodiments, the bank layer 350 may be formed as a black pixel defining layer (BPDL) including a black pigment.

The pixel opening 351 may have a similar shape to that of the pixel electrode 191 in a plan view. For example, the pixel opening 351 and the pixel electrode 191 may have an approximately polygonal shape in a plan view. In this case, corner portions of the pixel opening 351 and the pixel electrode 191 may be chamfered. In addition, the pixel electrode 191 may include an extension for connection with the drain electrode 175. However, the planar shapes of the pixel opening 351 and the pixel electrode 191 are not limited thereto, and may be variously changed.

In this case, a plurality of pixel electrodes 191 respectively corresponding to the first pixel (R), the second pixel (G), and the third pixel (B) may have different sizes in a plan view. Similarly, a plurality of pixel openings 351 respectively corresponding to the first pixel (R), the second pixel (G), and the third pixel (B) may have different sizes in a plan view. For example, the pixel opening 351 and the pixel electrode 191 corresponding to the first pixel (R) may respectively have a larger size than the pixel opening 351 and the pixel electrode 191 corresponding to the second pixel (G) in a plan view. In addition, the pixel opening 351 and pixel electrode 191 corresponding to the first pixel (R) may respectively have a smaller than or similar size to the pixel opening 351 and the pixel electrode 191 corresponding to the third pixel (B) in a plan view. However, the present inventive concept is not limited thereto, and the size of the pixel opening 351 and the pixel electrode 191 of each pixel R, G, or B may be variously altered as needed.

In addition, the pixels of the display device according to the embodiment may be disposed along the row direction and the column direction. For example, a plurality of pixel electrodes 191 corresponding to the second pixel (G) may be disposed to be spaced apart from each other at predetermined intervals in an N-th row, and the pixel electrode 191 corresponding to the third pixel (B) and the pixel electrode 191 corresponding to the first pixel (R) may be alternately disposed in an adjacent (N+1)-th row. Similarly, a plurality of pixel electrodes 191 corresponding to the second pixel (G) may be disposed to be spaced apart from each other at predetermined intervals in an adjacent (N+2)-th row, and the pixel electrodes 191 corresponding to the first pixel (R) and the pixel electrode 191 corresponding to the third pixel (B) may be alternately disposed in an adjacent (N+3)-th row.

In addition, a plurality of pixel electrode 191 corresponding to the second pixel (G) disposed in the N-th row may be alternately disposed with the pixel electrodes 191 corresponding to the third pixel (B) and the first pixel (R) disposed in the (N+1)-th row. For example, the pixel electrode 191 corresponding to the third pixel (B) and the pixel electrode 191 corresponding to the first pixel (R) may be alternately disposed in an M-th column, and a plurality of pixel electrodes 191 corresponding to the second pixel (G) may be disposed to be spaced apart from each other at predetermined intervals in an adjacent (M+1)-th column. Similarly, the pixel electrode 191 corresponding to the first pixel (R) and the pixel electrode 191 corresponding to the third pixel (B) may be alternately disposed in an adjacent (M+2)-th column, and a plurality of pixel electrodes 191 corresponding to the second pixel (G) may be disposed to be spaced apart from each other at predetermined intervals in an adjacent (M+3)-th column. The plurality of pixel electrodes 191 may be repeatedly disposed on the substrate 100 while having the above-described structure.

The emission layer 370 may be disposed within the pixel opening 351 defined by the bank layer 350. The emission layer 370 may be disposed on the pixel electrode 191. The emission layer 370 may include an organic material that emits red, green, and blue light. The emission layer 370 that emits red, green, and blue light may include a low molecular weight or high molecular weight organic material. The emission layer 370 disposed in the first pixel (R) may include an organic material that emits red light. The emission layer 370 disposed in the second pixel (G) may include an organic material that emits green light. The emission layer 370 disposed in the third pixel (B) may include an organic material that emits blue light.

Although the emission layer 370 is illustrated as a single layer in FIG. 4, actually, auxiliary layers such as an electron injection layer, an electron transport layer, a hole transport layer, and a hole injection layer may be further disposed above and below the emission layer 370. In this case, a hole injection layer and a hole transport layer may be disposed under the emission layer 370, and an electron transport layer and an electron injection layer may be disposed on the emission layer 370.

Although not shown, a spacer may be further disposed on the bank layer 350. The spacer may include the same material as the bank layer 350. However, the present inventive concept is not limited thereto, and the spacer may be made of a different material from that of the bank layer 350. The spacer may be an organic insulating film containing one or more of a polyimide, a polyamide, an acryl resin, benzocyclobutene, and a phenol resin.

The common electrode 270 may be disposed on the bank layer 350 and the emission layer 370. The common electrodes 270 of respective pixels R, G, and B may be connected to each other. The common electrode 270 may be formed of a same material and are formed in one piece on the substrate. The common electrode 270 is also referred to as a cathode, and may be formed of a transparent conductive layer including an indium tin oxide (ITO), an indium zinc oxide (IZO), an indium gallium zinc oxide (IGZO), and an indium tin zinc oxide (ITZO). In addition, the common electrode 270 may have a translucent characteristic, and in this case, may form a micro-cavity together with the pixel electrode 191. The micro-cavity may enhance emission of light with a specific wavelength upwardly by a gap disposed between the pixel electrode 191 and the common electrode 270 and characteristic of the pixel electrode 191 and the common electrode 270, and as a result, red, green, or blue colors may be displayed.

The pixel electrode 191, the emission layer 370, and the common electrode 270 may constitute a light emitting element ED. A portion in which the pixel electrode 191, the emission layer 370, and the common electrode 270 overlap may be a light emitting area of the light emitting element ED.

The encapsulation layer 400 may be disposed on the common electrode 270. The encapsulation layer 400 may include at least one inorganic film and at least one organic film. In the present embodiment, the encapsulation layer 400 may include a first inorganic encapsulation layer 410, an organic encapsulation layer 420, and a second inorganic encapsulation layer 430. However, this is only an example, and the number of inorganic and organic films constituting the encapsulation layer 400 may be variously changed. The first inorganic encapsulation layer 410, the organic encapsulation layer 420, and the second inorganic encapsulation layer 430 may be disposed in the display area DA and a portion of the non-display area NA. In some embodiments, the organic encapsulation layer 420 may be formed on the display area DA, and the first inorganic encapsulation layer 410 and the second inorganic encapsulation layer 430 may be formed on the display area DA and the non-display area NA. The encapsulation layer 400 is to protect the light emitting element ED from moisture or oxygen that may be introduced from outside, and one end of each of the first inorganic encapsulation layer 410 and the second inorganic encapsulation layer 430 may directly contact each other.

A buffer layer 501 may be disposed on the encapsulation layer 400. The buffer layer 501 may be formed as an inorganic insulating film, and an inorganic material included in the inorganic insulating film may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. In some embodiments, the buffer layer 501 may be omitted.

The second sensing electrode connecting part 541, the sensing insulating layer 510, and the plurality of sensing electrodes 520 and 540 may be disposed on the buffer layer 501. Although not shown, the first sensing electrode connecting part 521 in FIG. 2 may be disposed on the buffer layer 501. One of the first sensing electrode connecting part 521 in FIG. 2 and the second sensing electrode connecting part 541 may be disposed on the same layer as the plurality of sensing electrodes 520 and 540, and the other thereof may be disposed on a different layer from the plurality of sensing electrodes 520 and 540. Hereinafter, an example in which the second sensing electrode connecting part 541 is disposed on a different layer from the plurality of sensing electrodes 520 and 540 will be described.

The second sensing electrode connecting part 541, the sensing insulating layer 510, and the plurality of sensing electrodes 520 and 540 may constitute a sensing sensor. The sensing sensor may be classified into a resistive type, a capacitive type, an electro-magnetic type, an optical type, and the like. The sensing sensor according to the embodiment may use a capacitance type of sensor.

The second sensing electrode connecting part 541 may be disposed on the buffer layer 501, and the sensing insulating layer 510 may be disposed on the buffer layer 501 and the second sensing electrode connecting part 541. The sensing insulating layer 510 may include an inorganic insulation material or an organic insulation material. The inorganic insulation material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. The organic insulation material may include at least one of an acryl-based resin, a methacrylic-based resin, polyisoprene, a vinyl-based resin, an epoxy-based resin, a urethane-based resin, a cellulose-based resin, and a perylene-based resin.

The plurality of sensing electrodes 520 and 540 may be disposed on the sensing insulating layer 510. The plurality of sensing electrodes 520 and 540 may include a plurality of first sensing electrodes 520 and a plurality of second sensing electrodes 540. The first sensing electrode 520 and the second sensing electrode 540 may be electrically insulated from each other. The sensing insulating layer 510 includes an opening exposing an upper surface of the second sensing electrode connecting part 541, and the second sensing electrode connecting part 541 may connect second sensing electrodes 540 adjacent each other through contact holes formed in the sensing insulating layer 510 t. Meanwhile, the first sensing electrode connecting part 521 in FIG. 2 for connecting the first sensing electrode 520 may be formed on the same layer as the first sensing electrode 520 and the second sensing electrode 540.

The plurality of sensing electrodes 520 and 540 may include a conductive material having good conductivity. For example, the plurality of sensing electrodes 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), or a metal alloy thereof. The plurality of sensing electrodes 520 and 540 may be formed of a single-layered or multilayered structure. In this case, the plurality of sensing electrodes 520 and 540 may include openings so that light emitted from the light emitting diode is emitted upward without interference. In some embodiments, the plurality of sensing electrodes 520 and 540 may include a triple layer including an upper layer, an intermediate layer, and a lower layer, the upper layer and the lower layer may include titanium (Ti), and the intermediate layer may include aluminum (Al).

The first insulating layer 550 is disposed on the sensing electrodes 520 and 540. The first insulating layer 550 may be formed to cover upper surfaces and side surfaces of the sensing electrodes 520 and 540. The first insulating layer 550 may be disposed on the encapsulation layer 400, and the sensing insulating layer 510 may be disposed between the first insulating layer 550 and the encapsulation layer 400. The first insulating layer 550 may include a light absorbing material. That is, the first insulating layer 550 may be made of a black material capable of absorbing light. In this case, an optical density (OD) of the first insulating layer 550 may be about 1 or more and about 5 or less. However, the material of the first insulating layer 550 is not limited thereto, and it may be made of a transparent organic insulating material.

The first insulating layer 550 includes an opening 551. The opening 551 means a portion in which the first insulating layer 550 is removed. The opening 551 of the first insulating layer 550 may overlap the pixel opening 351. The opening 551 of the first insulating layer 550 may be larger than the pixel opening 351 in a plan view and may be formed in a shape surrounding the pixel opening 351. That is, the pixel opening 351 may be disposed within the opening 551 of the first insulating layer 550 in a plan view. A width of the opening 551 may gradually increase from a lower portion thereof toward the upper portion thereof. That is, the width of the opening 551 may gradually increase as a distance from the encapsulation layer 400 increases. Accordingly, a side surface of the first insulating layer 550 may be inclined with a predetermined inclination angle with respect to an upper surface of the encapsulation layer 400.

A separation distance between the pixel opening 351 and the opening 551 of the first insulating layer 550 may be constant. The separation distance between the pixel opening 351 and the opening 551 of the first insulating layer 550 means a shortest distance between an edge of the pixel opening 351 and an edge of the opening 551. The edge of the pixel opening 351 means a point at which an edge of the bank layer 350 contacts the pixel electrode 191. The edge of the opening 551 means a point at which an edge of the first insulating layer 550 contacts the sensing insulating layer 510. In the above, the separation distance between the pixel opening 351 and the opening 551 of the first insulating layer 550 has been described as constant, but is not limited thereto. The separation distance between the pixel opening 351 and the opening 551 of the first insulating layer 550 in one pixel may be varied depending on positions. In addition, the separation distance between the pixel opening 351 and the opening 551 of the first insulating layer 550 may be varied for each pixel.

The second insulating layer 555 may be disposed on the first insulating layer 550. The second insulating layer 555 may be formed to cover an upper surface and a side surface of the first insulating layer 550. The second insulating layer 555 may be disposed on the encapsulation layer 400. In this case, the sensing insulating layer 510 may be disposed between the second insulating layer 555 and the encapsulation layer 400. The second insulating layer 555 may be entirely disposed on the substrate 100.

The second insulating layer 555 may include a first portion 555*a* disposed on the opening 551 of the first insulating layer 550, a second portion 555*b* disposed on an upper surface of the first insulating layer 550, and a third portion 555*c* disposed on a side surface of the first insulating layer 550. The first portion 555*a* of the second insulating layer 555 may overlap the opening 551 of the first insulating layer 550, may be disposed within the opening 551, and may contact the sensing insulating layer 510. The second portion 555*b* of the second insulating layer 555 may overlap the upper surface of the first insulating layer 550 and may contact the upper surface of the first insulating layer 550. The third portion 555c of the second insulating layer 555 may overlap the side surface of the first insulating layer 550 and may contact the side surface of the first insulating layer 550. The third portion 555c of the second insulating layer 555 may be disposed between the first portion 555a and the second portion 555b in a plan view. The third portion 555c of the second insulating layer 555 extends from the first portion 555a to the second portion 555b to connect the first portion 555a and the second portion 555b.

The side surface of the first insulating layer 550 has a shape that is inclined with respect to the upper surface of the encapsulation layer 400 and the third portion 555c of the second insulating layer 555 is disposed on the side surface of the first insulating layer 550. Accordingly, the third portion 555c of the second insulating layer 555 may have a shape that is inclined with respect to the upper surface of the encapsulation layer 400. In addition, a distance from the upper surface of the encapsulation layer 400 to the upper surface of the second portion 555b of the second insulating layer 555 may be longer than a distance from the upper surface of the encapsulation layer 400 to the upper surface of the first portion 555a of the second insulating layer 555. In addition, a distance from the upper surface of the encapsulation layer 400 to the upper surface of the third portion 555c of the second insulating layer 555 may gradually increase from a point adjacent to the first portion 555a toward a point adjacent to the second portion 555b.

The third insulating layer 560 may be disposed on the second insulating layer 555. The third insulating layer 560 may include a light transmissive organic insulating material. The third insulating layer 560 may be disposed on the first portion 555a, the second portion 555b, and the third portion 555c of the second insulating layer 555. The third insulating layer 560 may be entirely disposed on the substrate 100.

A refractive index of the second insulating layer 555 is different from that of the third insulating layer 560. In this case, the refractive index of the third insulating layer 560 may be higher than the refractive index of the second insulating layer 555. That is, the second insulating layer 555 may be made of a material having a relatively low refractive index and the third insulating layer 560 may be made of a material having a relatively high refractive index. For example, the second insulating layer 555 may include a silicon oxide (SiOx) and the refractive index of the second insulating layer 555 may be about 1.30 or more and about 1.40 or less. The refractive index of the third insulating layer 560 may be about 1.42 or more and about 1.53 or less. However, this is only an example, and the refractive indexes of the second insulating layer 555 and the third insulating layer 560 may be variously changed.

A polarization layer 600 may be further disposed on the third insulating layer 560. The polarization layer 600 may be disposed in the sensing area TA, and may include a linear polarizing plate, a retardation plate, and the like.

A cover window 620 for protecting the sensing area TA and the display area DA may be further disposed on the polarization layer 600. In this case, an adhesive layer 610 may be further disposed between the polarization layer 600 and the cover window 620.

The display device according to the embodiment includes the first insulating layer 550 including the opening 551, and the second insulating layer 555 and the third insulating layer 560 disposed on the first insulating layer 550 and having different refractive indexes, thereby improving frontal visibility and light emitting efficiency of the display device. At least some of the light generated by the light emitting element ED is totally reflected on an interface between the third portion 555c of the second insulating layer 555 and the third insulating layer 560 so that the light may be condensed to the front.

Light L generated from the emission layer 370 may be emitted in various directions, and may be incident on the sensing area TA with various incident angles. In this case, some of the light L incident on the third insulating layer 560 of the sensing area TA may be emitted to the front, and the remaining light L may be reflected on an interface between the second insulating layer 555 and the third insulating layer 560. Particularly, when an incident angle of the light L incident on the third insulating layer 560 is larger than a threshold angle, the incident light L may be totally reflected on the interface between the second insulating layer 555 and the third insulating layer 560. That is, while the light L incident on the third insulating layer 560 having a relatively large refractive index proceeds to the second insulating layer 555 having a relatively small refractive index, total reflection may occur at the interface between the second insulating layer 555 and the third insulating layer 560. In this case, the total reflection may occur at the interface between the third portion 555c of the second insulating layer 555 having an inclined shape and the third insulating layer 560.

In this case, the interface between the third portion 555c of the second insulating layer 555 and the third insulating layer 560 may form a predetermined angle with a straight line parallel to the substrate 100. The interface between the third portion 555c of the second insulating layer 555 and the third insulating layer 560 may be parallel to the side surface of the first insulating layer 550. The side surface of the first insulating layer 550 may be inclined with a predetermined inclination angle with respect to the upper surface of the encapsulation layer 400. A side inclination angle of the first insulating layer 550 may be substantially the same as an angle formed by the interface between the third portion 555c of the second insulating layer 555 and the third insulating layer 560 with the upper surface of the encapsulation layer 400.

Hereinafter, a display device according to an embodiment and a display device according to a reference example will be compared and described below with reference to FIG. 5 and FIG. 6.

Figure 5:
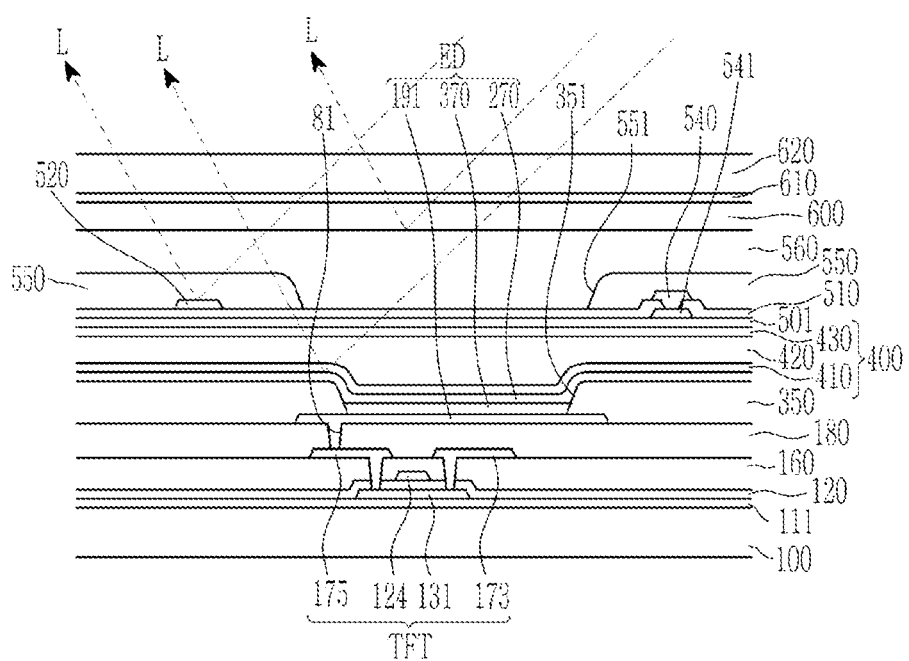
FIG. 5 illustrates a cross-sectional view of a display device according to a reference example.
Figure 6:
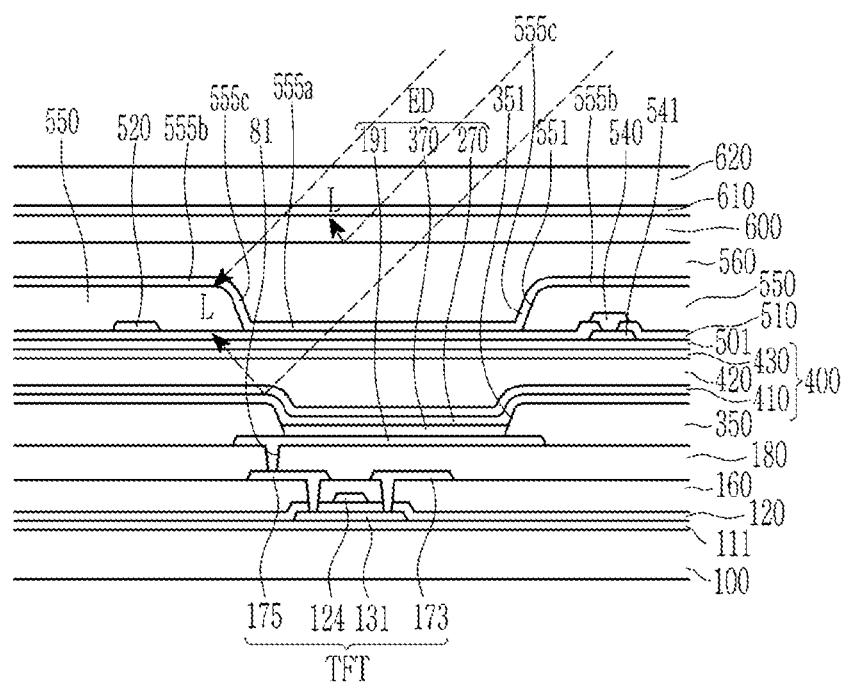
FIG. 6 illustrates a cross-sectional view of a display device according to an embodiment.

FIG. 5 illustrates a cross-sectional view of a display device according to a reference example, and FIG. 6 illustrates a cross-sectional view of a display device according to an embodiment.

As shown in FIG. 5, the display device according to the reference example includes most of the same constituent elements as the display device according to the embodiment, and they are different in that it does not include a constituent element corresponding to the second insulating layer. That is, the display device according to the reference example includes the first insulating layer 550 disposed on the sensing electrodes 520 and 540 and including the opening 551 and the third insulating layer 560 disposed on the first insulating layer 550. In this case, the third insulating layer 560 may be disposed within the opening 551 of the first insulating layer 550 and a refractive index of the third insulating layer 560 may be higher than a refractive index of the first insulating layer 550. Some of light generated from the light emitting element ED of the display device according to the reference example may pass through the third insulating layer 560 to be emitted to the front and the other thereof may be reflected at the interface between the third insulating layer 560 and side surface of the first insulating layer 550. Therefore, it is similar to the display device according to the embodiment in that the front visibility and light emitting efficiency of the display device may be improved.

In the display device according to the reference example, the refractive index of the first insulating layer 550 may be about 1.51, and the refractive index of the third insulating layer 560 may be about 1.65.

In the display device according to the embodiment, the second insulating layer 555 is further disposed on the first insulating layer 550, and the refractive index of the second insulating layer 555 may be about 1.30 or more and about 1.40 or less. In addition, the refractive index of the third insulating layer 560 disposed on the second insulating layer 555 may be about 1.42 or more and about 1.53 or less.

As shown in FIG. 5, in the display device according to the reference example, the third insulating layer 560 is made of a material having a high refractive index, so that some of light L incident from the outside is reflected on the surface of the third insulating layer 560. That is, surface reflectance of external light may be increased by the third insulating layer 560 having a high refractive index. As shown in FIG. 6, in the display device according to the embodiment, the light L incident from the outside may not be substantially reflected on the surface of the third insulating layer 560. Since the refractive index of the third insulating layer 560 of the display device according to the embodiment is relatively low compared with that of the display device according to the reference example, the surface reflectance of external light may be lowered.

In the display device according to the reference example, the first insulating layer 550 may be made of a transparent organic insulating material. Accordingly, as shown in FIG. 5, some of light L incident from the outside may be reflected on the common electrode 270, and may pass through the first insulating layer 550, the second insulating layer 555, and the third insulating layer 560 to be emitted toward a user. In addition, some of the light L incident from the outside may be reflected on the sensing electrodes 520 and 540, and may pass through the first insulating layer 550, the second insulating layer 555, and the third insulating layer 560 to be emitted toward a user. That is, in the display device according to the reference example, external light may be visually recognized by being reflected on a metal layer.

In the display device according to the embodiment, the first insulating layer 550 may be made of a light absorbing material. Accordingly, as shown in FIG. 6, some of the light L incident from the outside may be reflected on the common electrode 270, and the reflected light L may be absorbed by the first insulating layer 550. In addition, since the sensing electrodes 520 and 540 are covered by the first insulating layer 550, the light L incident from the outside toward the sensing electrodes 520 and 540 is absorbed by the first insulating layer 550 not to reach the sensing electrodes 520 and 540. Accordingly, the light L incident from the outside is not reflected on the sensing electrodes 520 and 540. That is, in the display device according to the embodiment, the reflectance of external light may be lowered.

In addition, in the display device according to the reference example, the third insulating layer 560 may be directly disposed on the first insulating layer 550, and the first insulating layer 550 and the third insulating layer 560 may be made of organic materials having different characteristics. Accordingly, in the process of forming the first insulating layer 550 and the opening 551 in the first insulating layer 550 and then forming the third insulating layer 560, the material of the third insulating layer 560 may not be filled in the opening 551 of the first insulating layer 550 due to lack of wettability. That is, the third insulating layer 560 may not be formed within the opening 551 of some pixels, and total reflection does not occur at the interface between the first insulating layer 550 and the third insulating layer 560, thus improvement in light emitting efficiency to the front may not be expected.

In the display device according to the embodiment, the second insulating layer 555 is disposed on the first insulating layer 550, and the third insulating layer 560 is disposed on the second insulating layer 555. The second insulating layer 555 may be made of a silicon oxide (SiOx) which is an oxygen-rich water-soluble material. In a process of forming the second insulating layer 555 after forming the opening 551 in the first insulating layer 550, the second insulating layer 555 is formed to cover the upper surface, the side surface, and the opening 551 of the first insulating layer 550. Since the second insulating layer 555 has excellent wettability, it may be smoothly formed on the first portion 555a and the third portion 555c disposed within the opening 551 as well as the second portion 555b of the second insulating layer 555 in the process of forming the third insulating layer 560. That is, the material of the third insulating layer 560 may be uniformly filled in the opening 551 of every pixel. Therefore, the light emitting efficiency to the front may be improved by the light totally reflected at the interface between the second insulating layer 555 and the third insulating layer 560.

Hereinafter, refractive indexes of the second insulating layer 555 and the third insulating layer 560 and total reflection efficiency at the interface will be described with reference to FIG. 7 and FIG. 8.

Figure 7:
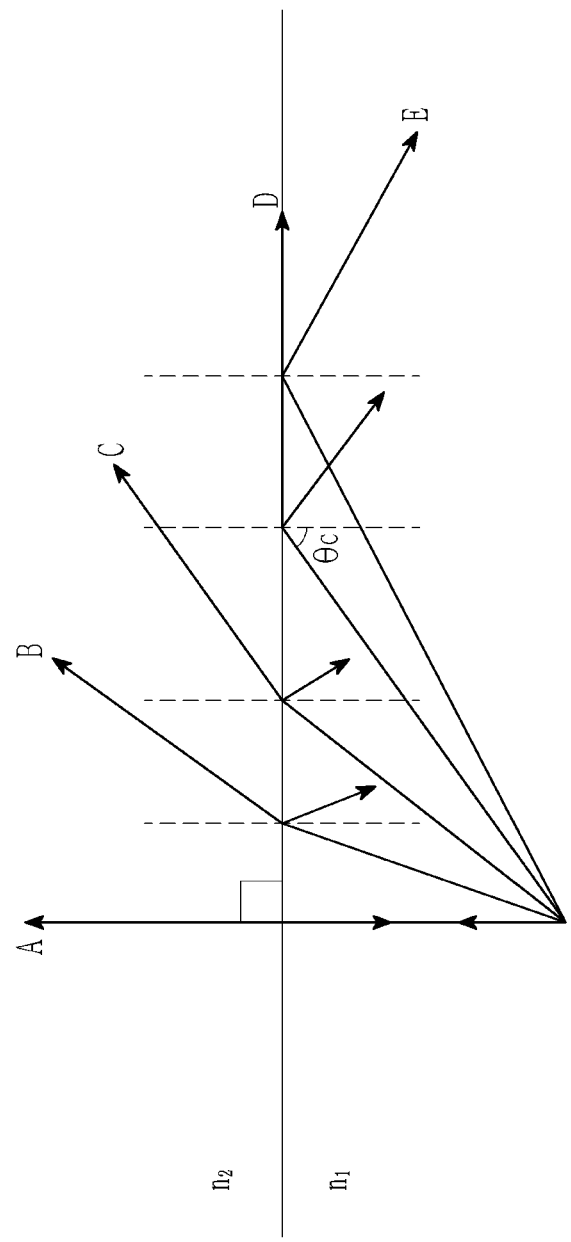
FIG. 7 illustrates a propagation direction of light passing through two layers adjacent to each other.
Figure 8:
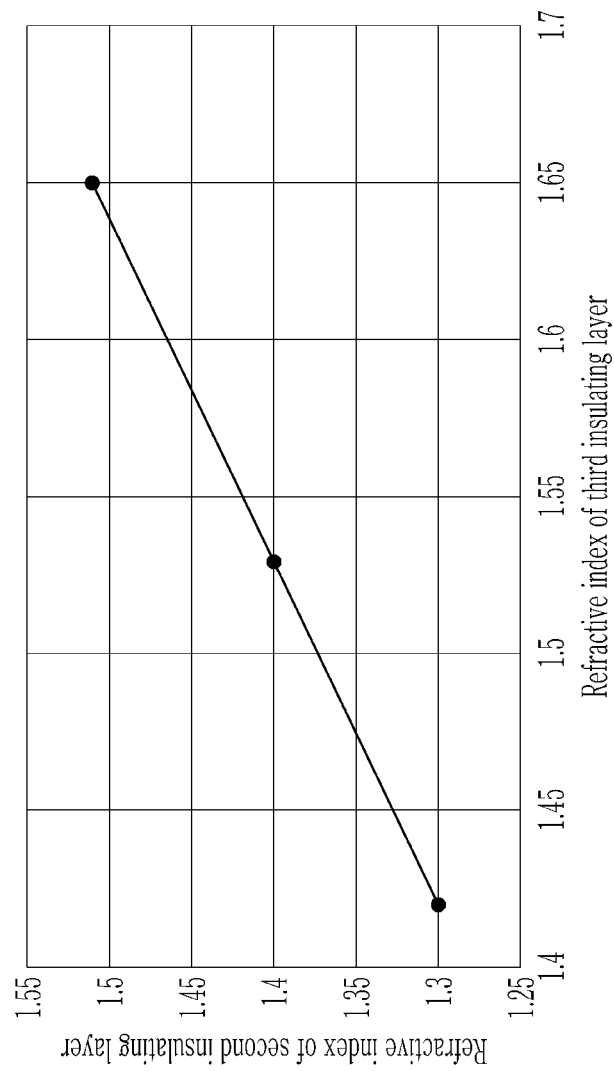
FIG. 8 illustrates a graph of a relationship between refractive indexes of a second insulating layer and a third insulating layer.

FIG. 7 illustrates a propagation direction of light passing through two layers adjacent to each other, and FIG. 8 illustrates a graph of a relationship between refractive indexes of a second insulation layer and a third insulation layer when critical angle is constant.

As shown in FIG. 7, light may proceed from a layer having a first refractive index ($n_1$) to a layer having a second refractive index ($n_2$). In this case, the refractive indexes of the two layers are different, wherein the first refractive index ($n_1$) may be larger than the second refractive index ($n_2$). As such, when light is incident on an interface between two media having different densities, reflectance of light increases as differences in density and refractive index between two materials increases and as an angle of incidence increases according to Snell's law. In addition, as in "A" to "E", as an angle of incidence increases, an angle of refraction also increases, and an angle formed between light and a line extending perpendicular to the interface between two media having different densities is greater in a media having a small refractive index than in a media having a large refractive index.

When light proceeds from a dense medium to a sparse medium, and when an angle of incidence is gradually increased to a certain angle of incidence ($\theta_c$), an angle of refraction becomes 90° as in "D", and the angle of incidence at this time is referred to as a critical angle. When light is incident at an angle larger than the critical angle, the light is not refracted as in "E", and may be totally reflected on the interface between the two layers. This phenomenon is referred to as total internal reflection. The critical angle ($\theta_c$) may be varied depending on refractive indexes of two adjacent layers, and may be determined depending on Equation 1 below.

$$\theta_c = \sin^{-1}\left(\frac{n_2}{n_1}\right) \quad \text{(Equation 1)}$$

($\theta_c$: critical angle, $n_1$: first refractive index, $n_2$: second refractive index)

As shown in FIG. 8, when the refractive index of the second insulating layer 555 is 1.51 and the refractive index of the third insulating layer 560 is 1.65, the critical angle may be about 66 degrees. In addition, when the refractive index of the second insulating layer 555 is 1.40 and the refractive index of the third insulating layer 560 is 1.53, the critical angle may be about 66 degrees. In addition, when the refractive index of the second insulating layer 555 is 1.30 and the refractive index of the third insulating layer 560 is 1.42, the critical angle may be about 66 degrees. That is, even if the refractive index of each of the second insulating layer 555 and the third insulating layer 560 decreases, when a ratio of the refractive index of the second insulating layer 555 to the refractive index of the third insulating layer 560 is the same, the critical angle may be the same.

Hereinafter, a method for lowering the refractive index of the second insulating layer 555 will be described with reference to FIG. 9.

Figure 9:
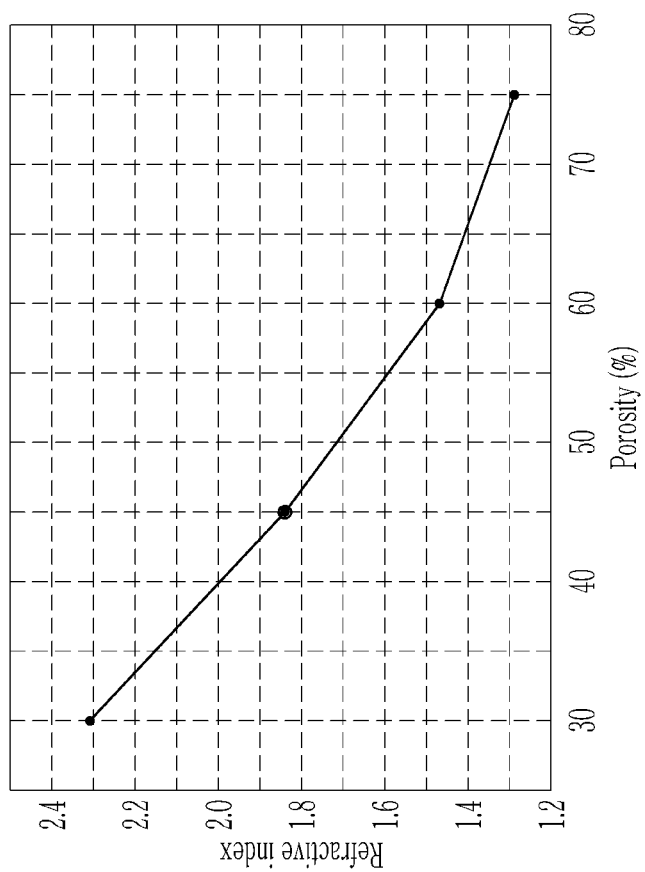
FIG. 9 illustrates a graph of a relationship between porosity and a refractive index.

FIG. 9 illustrates a graph of a relationship between porosity and a refractive index. FIG. 9 illustrates a refractive index of the second insulating layer 555 with respect to porosity in a silicon oxide (SiOx) forming the second insulating layer 555.

As shown in FIG. 9, when the porosity of the second insulating layer 555 is about 30%, the refractive index of the second insulating layer 555 may be about 2.3, and when the porosity of the second insulating layer 555 is about 45%, the refractive index of the second insulating layer 555 may be about 1.85. When the porosity of the second insulating layer 555 is about 60%, the refractive index of the second insulating layer 555 may be about 1.46, and when the porosity of the second insulating layer 555 is about 75%, the refractive index of the second insulating layer 555 may be about 1.3. It can be seen that the refractive index of the second insulating layer 555 decreases as the porosity included in the second insulating layer 555 made of a silicon oxide (SiOx) increases. Since the refractive index of air is 1, which is lower than that of a silicon oxide (SiOx), the refractive index of the second insulating layer 555 may be lowered by increasing the porosity of the second insulating layer 555.

As described above, the refractive index of the second insulating layer 555 of the display device according to the embodiment may be about 1.30 or more and about 1.40 or less. In this case, the porosity of the second insulating layer 555 may be about 60% or more and about 80% or less. Preferably, the porosity of the second insulating layer 555 may be about 65% or more and about 75% or less.

The second insulating layer 555 may be formed by using a chemical vapor deposition (CVD) method. When film formation conditions such as a ratio of gas, power, and pressure in a chemical vapor deposition process are changed, characteristics of the second insulating layer 555 may be changed. For example, by increasing a ratio of nitrous oxide ($N_2O$), the porosity of the second insulating layer 555 may be increased. In addition, the porosity of the second insulating layer 555 may be improved by various methods, and accordingly, the refractive index of the second insulating layer 555 may be lowered.

Hereinafter, a relationship between a refractive index and surface reflectance will be described with reference to FIG. 10.

Figure 10:
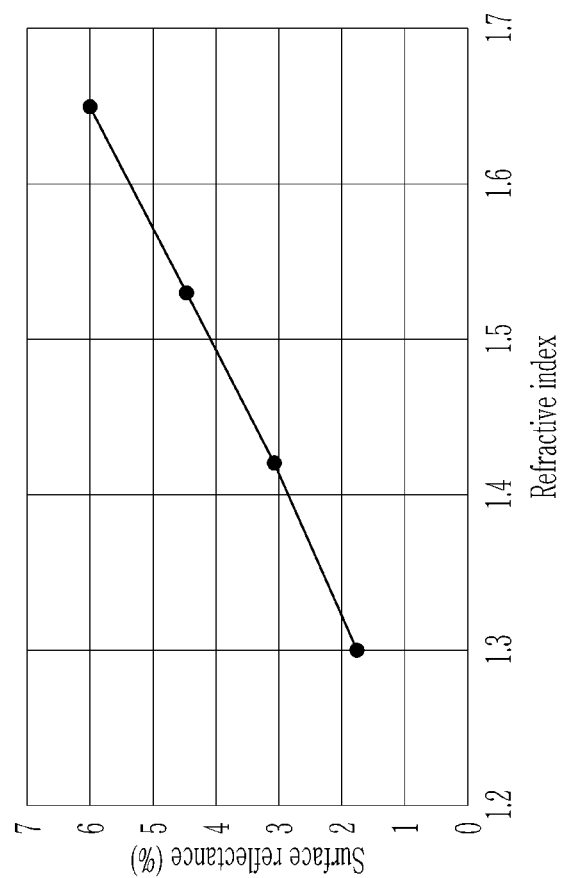
FIG. 10 illustrates a graph of a relationship between a refractive index and surface reflectance.

FIG. 10 illustrates a graph of a relationship between a refractive index and a surface reflectance. FIG. 10 illustrates reflectance on a surface of the third insulating layer 560 according to a refractive index of the third insulating layer 560.

As shown in FIG. 10, when the refractive index of the third insulating layer 560 is about 1.65, a probability that light incident from the outside is reflected on the surface of the third insulating layer 560, that is, the surface reflectance, may be about 6%. When the refractive index of the third insulating layer 560 is about 1.53, the surface reflectance of the third insulating layer 560 may be about 4.4%; when the refractive index of the third insulating layer 560 is about 1.42, the surface reflectance of the third insulating layer 560 may be about 3%; and when the refractive index of the third insulating layer 560 is about 1.3, the surface reflectance of the third insulating layer 560 may be about 1.7%. It can be seen that as the refractive index of the third insulating layer 560 decreases, the surface reflectance of the third insulating layer 560 decreases.

As described above, the refractive index of the third insulating layer 560 of the display device according to the embodiment may be about 1.42 or more and about 1.53 or less. In this case, the surface reflectance of the third insulating layer 560 may be about 3% or more and about 4.4% or less. Therefore, the surface reflectance may be lowered compared to the case in which the refractive index of the third insulating layer 560 is about 1.65.

Hereinafter, a thickness and an optical density of the first insulating layer 550 will be described with reference to FIG. 11.

Figure 11:
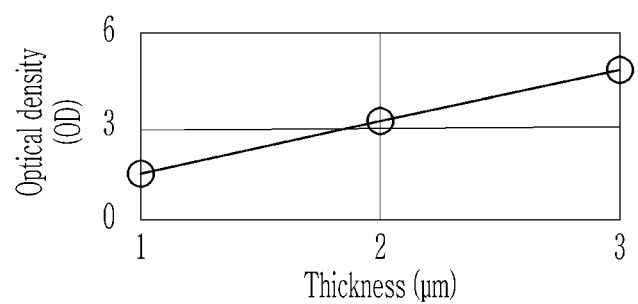
FIG. 11 illustrates a graph of a relationship between a thickness of a first insulating layer of a display device and an optical density according to an embodiment.

FIG. 11 illustrates a graph of a relationship between a thickness of a first insulating layer of a display device and an optical density according to an embodiment. As shown in FIG. 11, when the thickness of the first insulating layer 550 is about 1 µm, the optical density of the first insulating layer 550 may be about 1.6. When the thickness of the first insulating layer 550 is about 2 µm, the optical density of the first insulating layer 550 may be about 3.2, and when the thickness of the first insulating layer 550 is about 3 µm, the optical density of the first insulating layer 550 may be about 4.8. It can be seen that the optical density increases as the thickness of the first insulating layer 550 increases.

As described above, the optical density of the first insulating layer 550 may be about 1 or more and about 5 or less. When the first insulating layer 550 is made of a material having an optical density of about 1.6 per thickness of about 1 µm, the thickness of the first insulating layer 550 may be about 0.625 µm or more and about 3.125 µm or less. When the first insulating layer 550 is made of a material having a lower optical density per unit thickness, the thickness of the first insulating layer 550 may be increased. In addition, when the first insulating layer 550 is made of a material having a higher optical density per unit thickness, the thickness of the first insulating layer 550 may reduced While this disclosure has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
   a substrate;
   a transistor disposed on the substrate;
   a light emitting element connected to the transistor;
   an encapsulation layer disposed on the light emitting element;
   a sensing electrode disposed on the encapsulation layer;
   a first insulating layer disposed on the sensing electrode and including an opening;
   a second insulating layer disposed on the first insulating layer to cover a center portion of the opening; and
   a third insulating layer disposed on the second insulating layer,
   wherein a refractive index of the third insulating layer is higher than that of the second insulating layer.

2. The display device of claim 1, wherein a refractive index of the third insulating layer is 1.42 or more and 1.53 or less.

3. The display device of claim 1, wherein a refractive index of the second insulating layer is 1.30 or more and 1.40 or less.

4. The display device of claim 3, wherein a refractive index of the third insulating layer is 1.42 or more and 1.53 or less.

5. The display device of claim 4, wherein the first insulating layer includes a light absorbing material.

6. The display device of claim 5, wherein an optical density of the first insulating layer is about 1 or more and about 5 or less.

7. The display device of claim 3, wherein the second insulating layer includes a silicon oxide.

8. The display device of claim 7, wherein porosity of the second insulating layer is 65% or more and 75% or less.

9. The display device of claim 1, wherein the second insulating layer comprising:
   a first portion disposed on the opening of the first insulating layer,
   a second portion disposed on an upper surface of the first insulating layer, and
   a third portion disposed between the first portion and the second portion in a plan view, and
   wherein the third portion is disposed on a side surface of the first insulating layer.

10. The display device of claim 9, wherein the side surface of the first insulating layer has a shape that is inclined with respect to an upper surface of the encapsulation layer.

11. The display device of claim 10, wherein a distance from the upper surface of the encapsulation layer to an upper surface of the second portion is longer than a distance from the upper surface of the encapsulation layer to an upper surface of the first portion, and
    wherein the third portion has a shape that is inclined with respect to the upper surface of the encapsulation layer.

12. The display device of claim 10, wherein at least some of light emitted from the light emitting element is totally reflected on an interface between the third portion of the second insulating layer and the third insulating layer to be emitted.

13. The display device of claim 1, wherein the first insulating layer includes a light absorbing material.

14. The display device of claim 13, wherein an optical density of the first insulating layer is 1 or more and 5 or less.

15. The display device of claim 1, wherein the second insulating layer includes a silicon oxide.

16. The display device of claim 15, wherein porosity of the second insulating layer is 65% or more and 75% or less.

17. The display device of claim 1, wherein the light emitting element comprising:
    a pixel electrode connected to the transistor,
    an emission layer disposed on the pixel electrode, and
    a common electrode disposed on the emission layer.

18. The display device of claim 17, further comprising a bank layer disposed on the pixel electrode and including a pixel opening overlapping the pixel electrode,
    wherein the emission layer is disposed within the pixel opening, the common electrode is disposed on the bank layer, and the opening overlaps the pixel opening.

19. The display device of claim 18, wherein the opening is larger than the pixel opening in a plan view and have a shape surrounding the pixel opening.

20. The display device of claim 18, further comprising:
    a polarization layer disposed on the third insulating layer, and
    a cover window disposed on the polarization layer.

* * * * *